United States Patent
Lin et al.

(10) Patent No.: US 10,043,885 B2
(45) Date of Patent: Aug. 7, 2018

(54) BI-LAYER METAL DEPOSITION IN SILICIDE FORMATION

(71) Applicant: Taiwan Semiconductor Manufacturing Company, Ltd., Hsinchu (TW)

(72) Inventors: Sheng-Hsuan Lin, Zhubei (TW); Chih-Wei Chang, Chu-Dong Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/899,070

(22) Filed: Feb. 19, 2018

(65) Prior Publication Data

US 2018/0175159 A1    Jun. 21, 2018

Related U.S. Application Data

(63) Continuation of application No. 14/742,336, filed on Jun. 17, 2015, now Pat. No. 9,905,670, which is a
(Continued)

(51) Int. Cl.
*H01L 21/00* (2006.01)
*H01L 29/66* (2006.01)
(Continued)

(52) U.S. Cl.
CPC ...... *H01L 29/665* (2013.01); *H01L 21/28518* (2013.01); *H01L 21/32053* (2013.01); *H01L 21/477* (2013.01); *H01L 21/7685* (2013.01); *H01L 21/76805* (2013.01); *H01L 21/76843* (2013.01); *H01L 21/76855* (2013.01); *H01L 21/76897* (2013.01); *H01L 29/66795* (2013.01); *H01L 29/41791* (2013.01)

(58) Field of Classification Search
CPC ............ H01L 29/665; H01L 21/28518; H01L 21/32053; H01L 21/477; H01L 21/76805; H01L 21/7685; H01L 21/76855; H01L 21/76897; H01L 29/66795
See application file for complete search history.

(56) References Cited

U.S. PATENT DOCUMENTS

| | | | |
|---|---|---|---|
| 6,121,139 A | 9/2000 | Chang et al. | |
| 6,127,267 A | 10/2000 | Matsubara et al. | |

(Continued)

FOREIGN PATENT DOCUMENTS

| | | |
|---|---|---|
| CN | 1214534 A | 4/1999 |
| CN | 102197457 A | 9/2011 |
| TW | 200919636 A | 5/2009 |

*Primary Examiner* — Richard Booth
(74) *Attorney, Agent, or Firm* — Slater Matsil, LLP

(57) ABSTRACT

A method includes performing a first sputtering to form a first metal film on a surface of a semiconductor region. The first sputtering is performed using a first ion energy. The method further includes performing a second sputtering to form a second metal film over and contacting the first metal film, wherein the first and the second metal films includes a same metal. The second sputtering is performed using a second ion energy lower than the first ion energy. An annealing is performed to react the first and the second metal films with the semiconductor region to form a metal silicide.

20 Claims, 11 Drawing Sheets

Related U.S. Application Data continuation of application No. 14/024,209, filed on Sep. 11, 2013, now Pat. No. 9,076,823.

(51) Int. Cl.
*H01L 21/285* (2006.01)
*H01L 21/3205* (2006.01)
*H01L 21/477* (2006.01)
*H01L 21/768* (2006.01)
*H01L 29/417* (2006.01)

(56) References Cited

U.S. PATENT DOCUMENTS

| | | | |
|---|---|---|---|
| 6,337,272 | B1 | 1/2002 | Hamanaka |
| 6,355,549 | B1 | 3/2002 | Schuegraf |
| 8,435,893 | B1 | 5/2013 | Nian et al. |
| 9,076,823 | B2 * | 7/2015 | Lin .................... H01L 29/66795 |
| 9,905,670 | B2 * | 2/2018 | Lin ....................... H01L 29/665 |
| 2008/0311711 | A1 | 12/2008 | Hampp et al. |
| 2009/0050471 | A1 | 2/2009 | Chiu et al. |
| 2010/0052034 | A1 | 3/2010 | Cheng et al. |
| 2010/0096253 | A1 | 4/2010 | Cao et al. |
| 2015/0072494 | A1 | 3/2015 | Lin et al. |

* cited by examiner

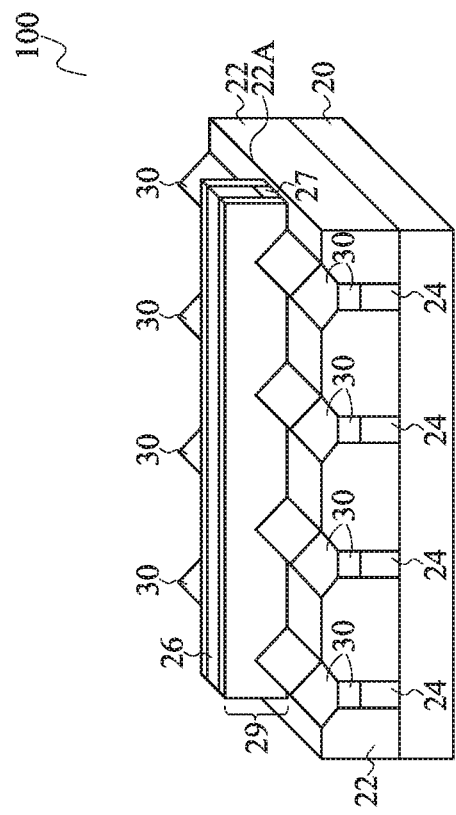
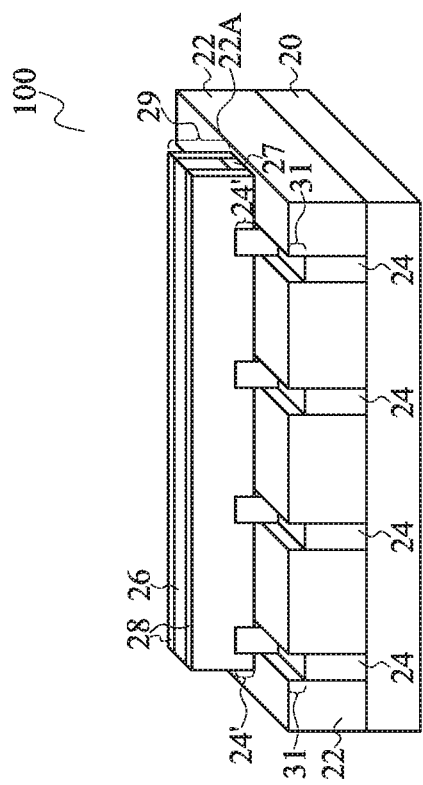

US 10,043,885 B2

BI-LAYER METAL DEPOSITION IN SILICIDE FORMATION

PRIORITY CLAIM AND CROSS-REFERENCE

This application is a continuation of U.S. patent application Ser. No. 14/742,336, entitled "Bi-Layer Metal Deposition in Silicide Formation," filed on Jun. 17, 2015, which is a continuation of U.S. patent application Ser. No. 14/024,209, entitled "Bi-Layer Metal Deposition in Silicide Formation," filed on Sep. 11, 2013, now U.S. Pat. No. 9,076,823 issued Jul. 7, 2015, which applications are incorporated herein by reference.

BACKGROUND

Transistors typically include semiconductor regions used to form the source regions and drain regions. The contact resistance between metal contact plugs and the semiconductor regions is high. Accordingly, metal silicides are formed on the surfaces of the semiconductor regions such as silicon regions, germanium regions, silicon germanium regions in order to reduce the contact resistance. The contact plugs are formed to contact the silicide regions, and the contact resistance between the contact plugs and the silicide regions are low.

A typical silicidation process includes forming a metal layer on the surfaces of the semiconductor regions, and then performing an annealing, so that the metal layer reacts with the semiconductor regions to form the silicide regions. After the reaction, the upper portions of the metal layer may be left un-reacted. An etching step is then performed to remove the un-reacted portions of the metal layer.

With the increasing down-sizing of integrated circuits, the silicide regions also become increasingly smaller. Accordingly, the contact resistance of the electrical contacts becomes increasingly higher.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 12 are cross-sectional views and perspective views of intermediate stages in the manufacturing of a Fin Field-Effect Transistor (FinFET) and the respective contacts in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Fin Field-Effect Transistor (FinFET) and the method of forming the same are provided in accordance with various exemplary embodiments. The intermediate stages of forming the FinFET are illustrated. The intermediate stages of forming contacts to the FinFET are also illustrated. The variations of the embodiments are discussed. Throughout the various views and illustrative embodiments, like reference numbers are used to designate like elements. It is appreciated that although FinFETs are used as examples to explain the concept of the present disclosure, the concepts may readily be applied in the contact formation of planar transistors.

Figure 1:
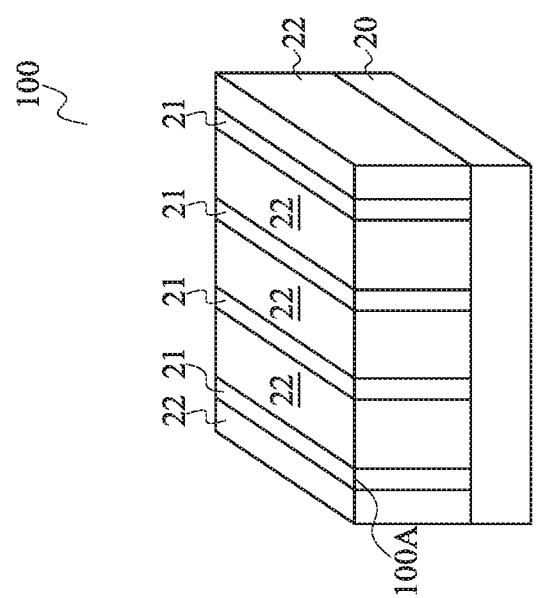

FIGS. 1 through 12 are cross-sectional views and perspective views of intermediate stages in the manufacturing of a FinFET and the respective contacts in accordance with some exemplary embodiments. FIG. 1 illustrates a perspective view of an initial structure. The initial structure includes wafer 100 including substrate 20. Substrate 20 may be semiconductor substrate, which may further be a silicon substrate, a silicon germanium substrate, or a substrate formed of other semiconductor materials. Substrate 20 may be doped with a p-type or an n-type impurity. Isolation regions such as Shallow Trench Isolation (STI) regions 22 may be formed to extend from a top surface of substrate 20 into substrate 20, wherein the top surface of substrate 20 is a major surface 100A of wafer 100. The portions of substrate 20 between neighboring STI regions 22 are referred to as semiconductor strips 21. The top surfaces of semiconductor strips 21 and the top surfaces of STI regions 22 may be substantially level with each other.

Figure 2:
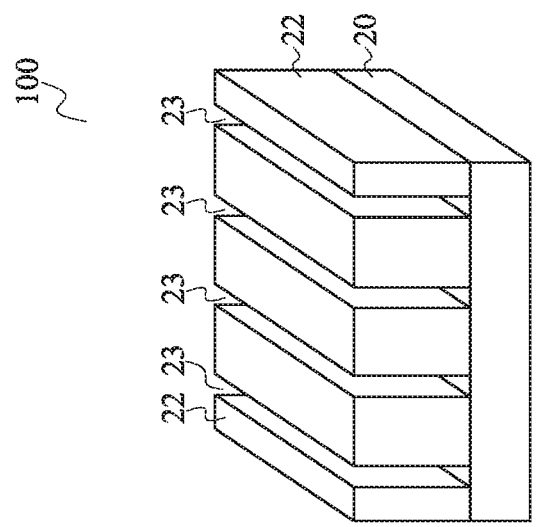
Figure 3:
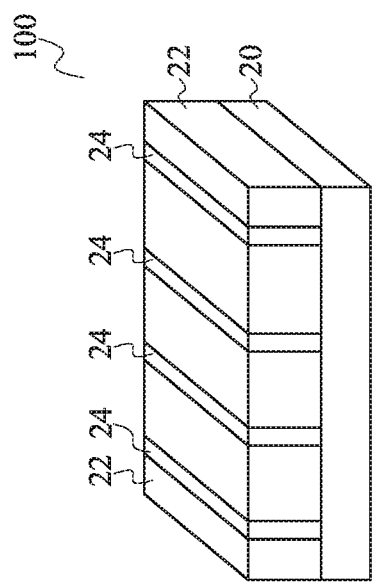

FIGS. 2 and 3 illustrate the replacement of semiconductor strips 21 in FIG. 1 with semiconductor strips 24 in FIG. 3 in accordance with some embodiments. In alternative embodiments, the semiconductor strips 21 in FIG. 1 are not replaced, and hence act as semiconductor strips 24 shown in FIGS. 4 through 13. Referring to FIG. 2, at least the upper portions, or substantially entireties, of semiconductor strips 21 are removed. Accordingly, recesses 23 are formed in STI regions 22. Next, an epitaxy is performed to epitaxially grow semiconductor strips 24 in recesses 23, forming the structure in FIG. 3. Semiconductor strips 24 may have a lattice constant greater than, substantially equal to, or smaller than, the lattice constant of substrate 20. In some embodiments, semiconductor strips 24 comprise silicon germanium, a III-V compound semiconductor, or the like. The silicon germanium in semiconductor strips 24 may have a germanium atomic percentage greater than about 15 percent, or between about 15 percent and about 60 percent. The germanium atomic percentage may also be higher, and semiconductor strips 24 may be substantially pure germanium regions with a germanium atomic percentage higher than, for example, about 95 percent. During the epitaxy of semiconductor strips 24, a p-type impurity such as boron may be in-situ doped with the proceeding or the epitaxy. STI regions 22 are then recessed, so that top portions of semiconductor strips 24 are higher than the top surfaces of STI regions 22 to form semiconductor fins 24'.

Figure 4:
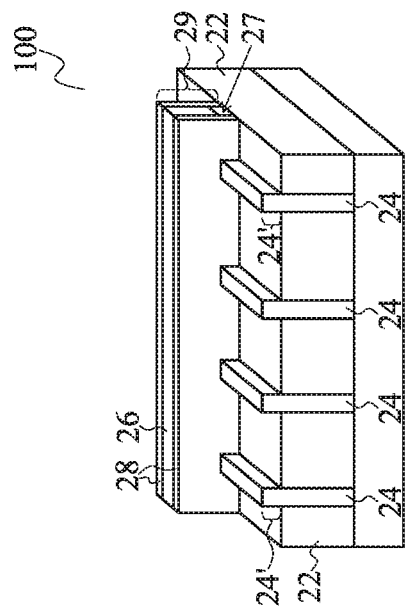

Referring to FIG. 4, gate stack 29 is formed on the top surface and sidewalls of semiconductor fins 24'. Gate stack 29 includes gate dielectric 27, and gate electrode 26 over gate dielectric 27. Gate electrode 26 may be formed, for example, using polysilicon, although other materials such as metal silicides, metal nitrides, or the like, may also be used. Gate stack 29 may also comprise a hard mask layer (not shown) over gate electrode 26, wherein the hard mask layer may comprise silicon nitride, for example. Gate stack 29 crosses over a plurality of semiconductor fins 24' and/or STI regions 22. Gate stack 29 may also have a lengthwise direction substantially perpendicular to the lengthwise direction of semiconductor fins 24'. In some embodiments, gate stack 29 forms the gate stack of the resulting FinFET. In alternative embodiments, gate stack 29 is a dummy gate stack, and will be replaced by a replacement gate in a subsequent step.

Next, as also shown in FIG. 4, gate spacers 28 are formed on the sidewalls of gate stack 29. In some embodiments, gate spacers 28 comprise silicon oxide, silicon nitride, or the like, and may have a multi-layer structure.

Referring to FIG. 5, an etching step is performed to etch portions of semiconductor fins 24' that are not covered by gate stack 29 and gate spacers 28. The resulting top surfaces 24A of the recessed semiconductor 24 may thus be substantially level with or lower than the top surfaces 22A of STI regions 22. Recesses 31 are accordingly formed between STI regions 22. Recesses 31 are located on opposite sides of gate stack 29. Next, as shown in FIG. 6, epitaxy regions 30 are formed by selectively growing a semiconductor material in recesses 31. In some exemplary embodiments, epitaxy regions 30 comprise silicon germanium. Alternatively, epitaxy regions 30 are formed of pure or substantially pure germanium, for example, with a germanium atomic percentage greater than about 95 percent. After recesses 31 are filled with epitaxy regions 30, the further epitaxial growth of epitaxy regions 30 causes epitaxy regions 30 to expand horizontally, and facets start to form. Furthermore, some of top surfaces 22A of STI regions 22 are underlying and aligned to portions of epitaxy regions 30 due to the lateral growth of epitaxy regions 30.

After the epitaxy step, epitaxy regions 30 may be implanted to form source and drain regions, which are also denoted using reference numeral 30. Source and drain regions 30 are on opposite sides of gate stack 29, and may be overlying and overlapping portions of surfaces 22A of STI regions 22.

Figure 7:
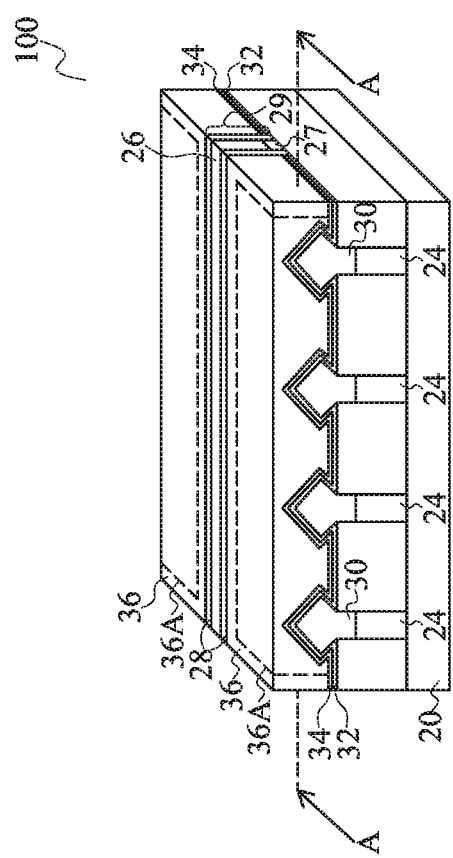

FIG. 7 illustrates a perspective view of the structure after buffer oxide layer 32, Contact Etch Stop Layer (CESL) 34, and Inter-Layer Dielectric (ILD) 36 are formed. In some embodiments, buffer oxide layer 32 comprises silicon oxide, and CESL 34 comprises silicon nitride, silicon carbonitride, or the like. Buffer oxide layer 32 and CESL 34 may be formed using Atomic Layer Deposition (ALD), for example. ILD 36 may comprise Flowable oxide formed using, for example Flowable Chemical Vapor Deposition (FCVD). A Chemical Mechanical Polish (CMP) may be performed to level the top surfaces of ILD 36, gate stack 29, and gate spacers 28 with each other.

Figure 8:
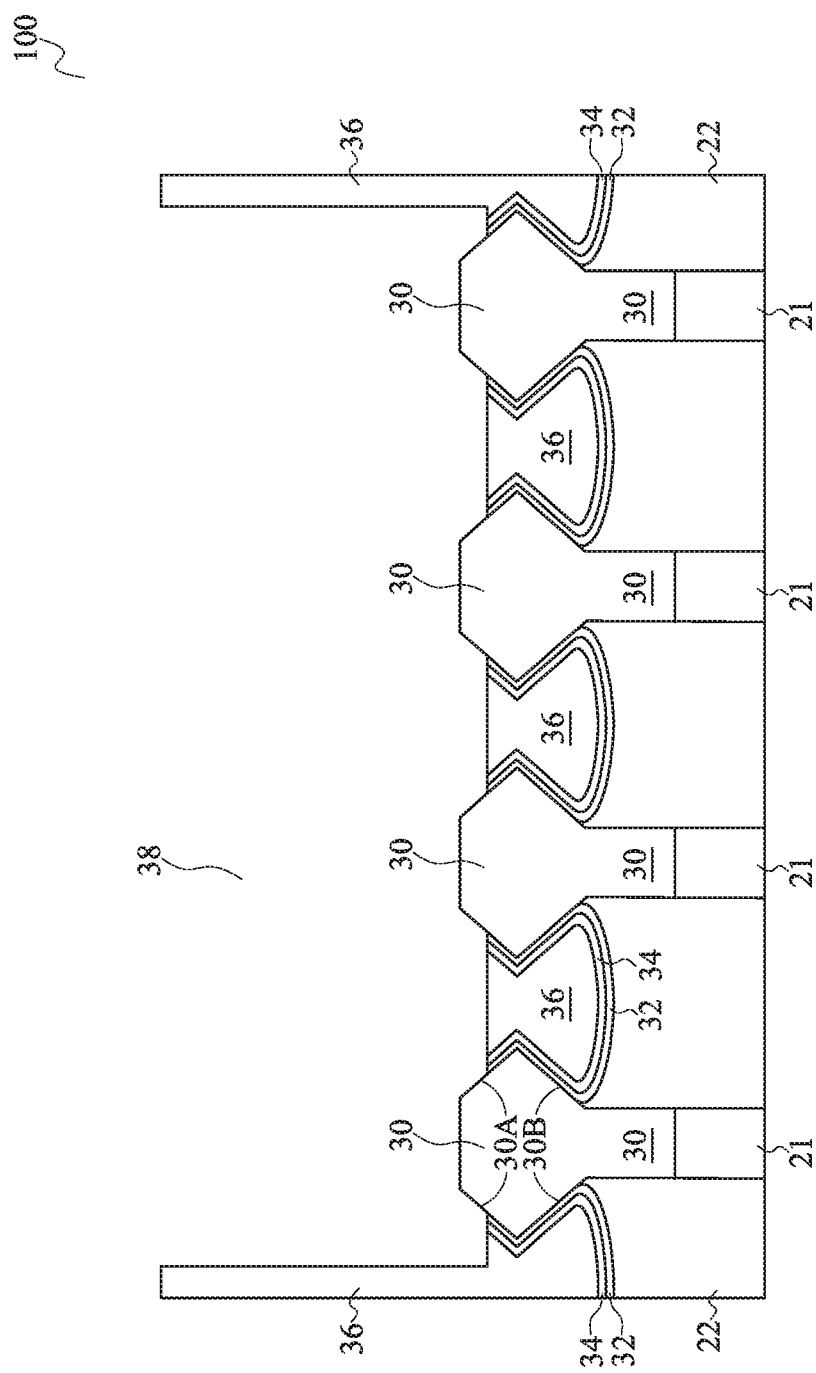

Next, the portions 36A of ILD 36 are removed to form contact openings, wherein the removed portions 36A are opposite sides of gate stack 29. One of the contact openings 38 is shown in FIG. 8. FIGS. 8 through 13 are cross-sectional views obtained from the same vertical plane containing line A-A in FIG. 7. As shown in FIG. 8, ILD 36 is recessed, and hence contact opening 38 is located in ILD 36. Source and drain regions 30 include a plurality of spade-shaped epitaxy regions separated from each other. Epitaxy regions 30 may have facets 30A and 30B. Facets 30A are upward facing facets and facets 30B are downward facing facets. Facets 30A and 30B may be on <111> planes of epitaxy regions 30, which may comprise silicon germanium or substantially pure germanium (doped or not doped with boron, for example). Buffer oxide layer 32 is formed on facets 30A and 30B. CESL 34 is formed on buffer oxide layer 32. Both buffer oxide layer 32 and CESL 34 may be conformal layers.

In some embodiments, ILD 36 is recessed to a level that at least the portions of CESL 34 on the top surfaces of epitaxy regions 30 are exposed. The top portions of CESL 34 and the underlying buffer layer 32 (if any) are also removed to expose the top surfaces of epitaxy regions 30. In some embodiments, as illustrated in FIG. 8, upward facing facets 30A are partially exposed to contact opening 38, with the upper parts of upward facing facets being exposed, and the lower parts of upward facing facets 38 being buried in ILD 36. In alternative embodiments, substantially entireties of upward facing facets 30A are covered by ILD 36. In yet alternative embodiments, substantially entireties of upward facing facets 30A are exposed to contact opening 38. Downward facing facets 30B may be buried in ILD 36.

Figure 9:
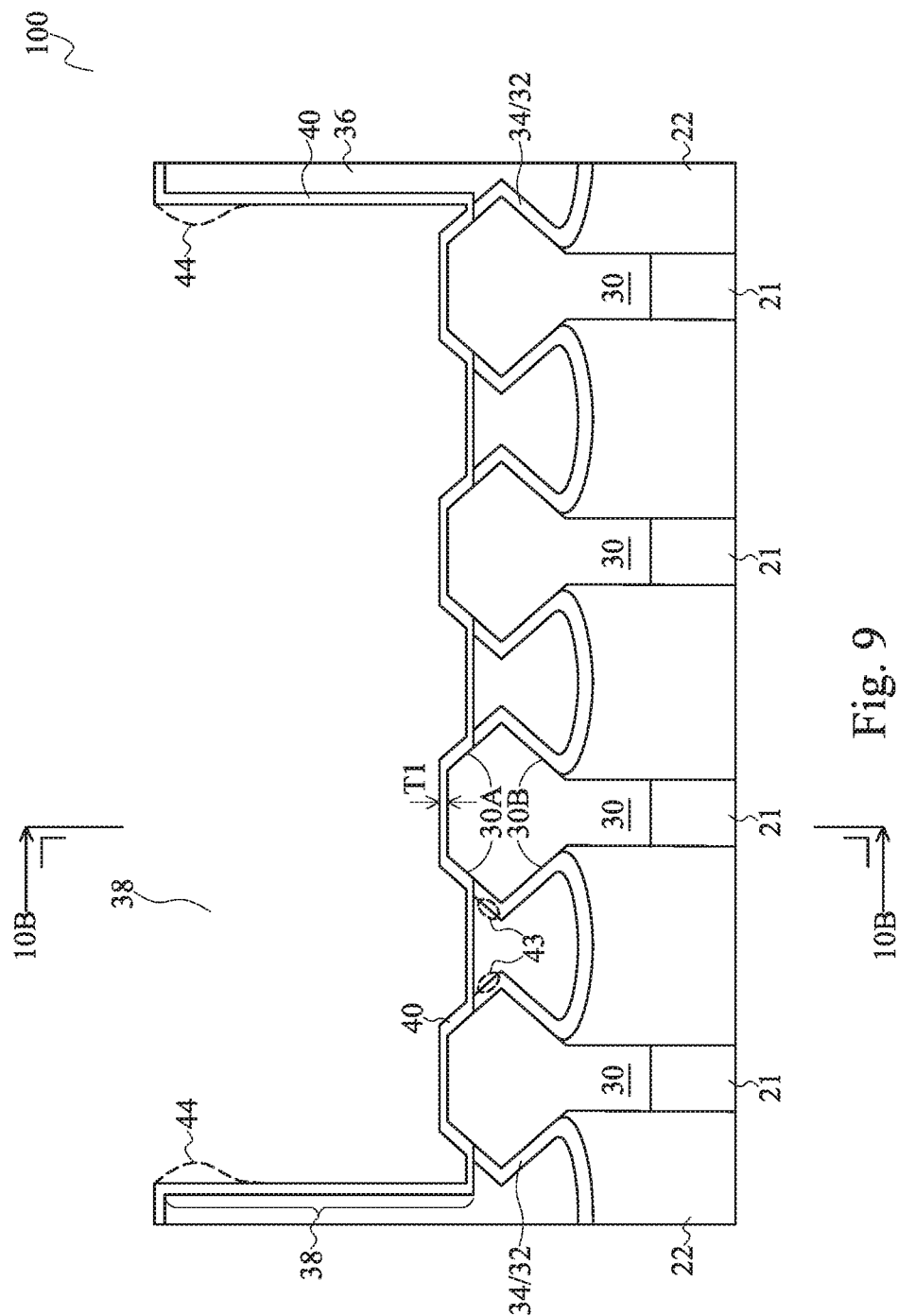

Referring to FIG. 9, metal layer 40 is deposited using, for example, Physical Vapor Deposition (PVD) (sputtering). In some embodiments, metal layer 40 comprises nickel. Alternatively, other metals such as cobalt, platinum, or the like, may also be used. Thickness T1 of metal layer 40 may be in the range between about 10 Å and about 20 Å. It is appreciated, however, that the values recited throughout the description are merely examples, and may be changed to different values.

Metal layer 40 is deposited using first ion energy E1. The ion energy is the energy of the metal ions that are deposited to form metal layer 40. The first ion energy E1 is relatively high, and hence the resulting metal layer 40 is porous. Furthermore, with a relatively high energy, more ions of the sputtered metal penetrate into ILD 36 to reach deeper positions, for example, to the illustrated positions 43. This advantageous results in the increase in the area of the subsequently formed silicides regions, and hence the contact resistance may be reduced. In some exemplary embodiments, the first ion energy E1 is in the range between about 200 eV and about 300 eV, although higher or lower energies may be used. Furthermore, during the deposition of metal layer 40, the chamber for forming metal layer 40 may have first pressure P1 smaller than about 10 mTorr.

Figure 10A:
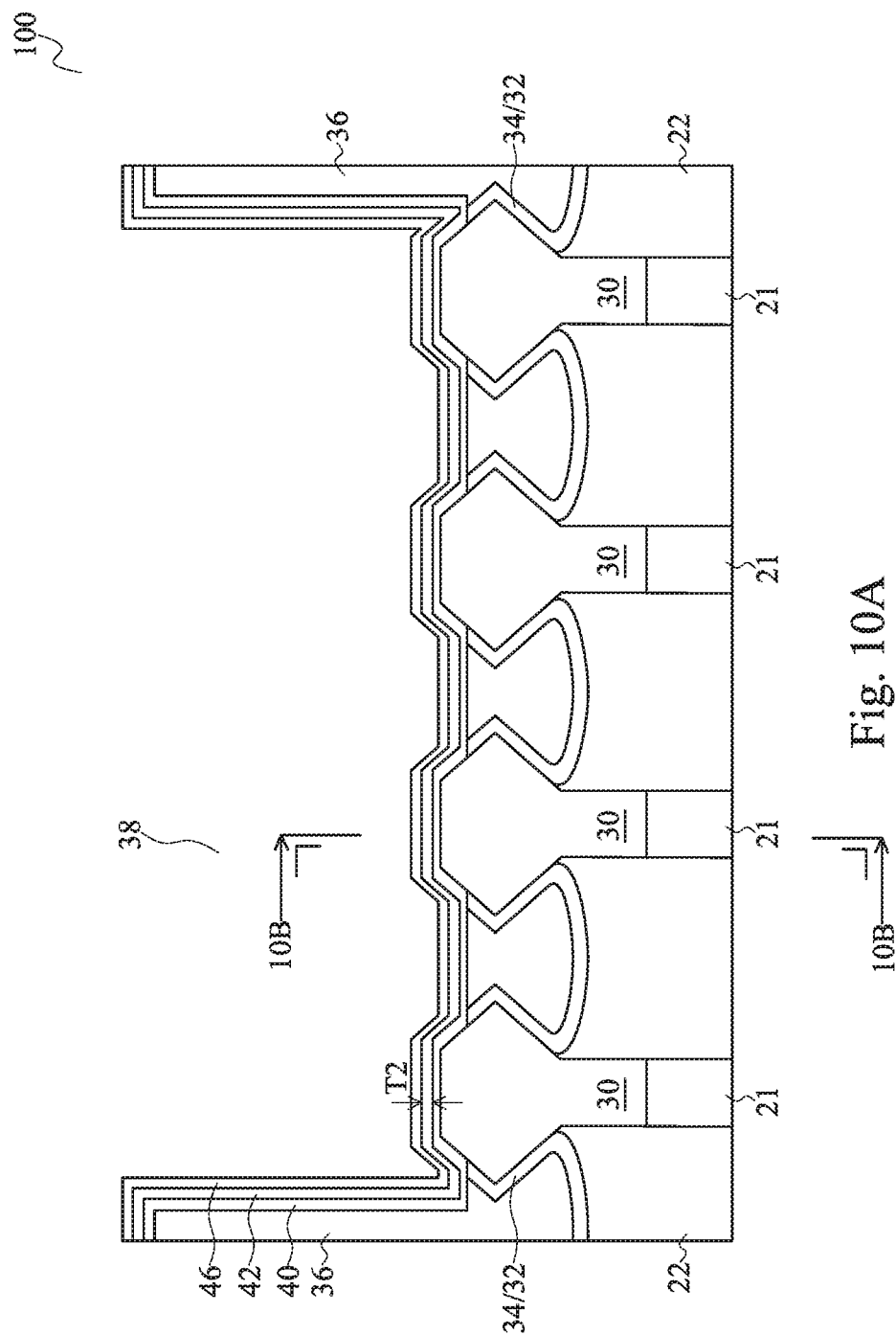

FIG. 10A illustrates the formation of metal layer 42 over metal layer 40. Metal layer 40 may also be deposited using, for example, PVD. Metal layers 40 and 42 may include the same metal or different metals. For example, metal layer 42 may include nickel, cobalt, platinum, or the like. Thickness T2 of metal layer 42 may be in the range between about 50 Å and about 60 Å, although thickness T2 may be greater or smaller. Metal layers 40 and 42 may be deposited in a same process chamber, with no vacuum break occurring between the formation of metal layers 40 and 42.

Metal layer 42 is deposited using second ion energy E2 lower than first ion energy E1. In some embodiments, the ratio E1/E2 is greater than about 2, and may be greater than about 4. The second ion energy E2 is relatively low, and hence the resulting metal layer 42 is less porous than metal layer 40. Experimental results indicated that metal layer 40 has a sheet resistance higher than the sheet resistance of metal layer 42 even when both metal layers 40 and 42 are formed of a same metal. This indicates that metal layer 40 is more porous than metal layer 42. It is realized that since metal layer 40 is deposited using the relatively high ion energy, it may suffer from overhang, which is schematically illustrated as 44 in FIG. 9. Being formed using the relatively low ion energy, metal layer 42 is less prone to the overhangs. Furthermore, the chamber for forming metal layer 42 may have a pressure higher than the pressure for depositing metal layer 40. For example, before the formation of metal layer 42 is started, the pressure in the chamber for forming metal layers 40 and 42 may be adjusted to second pressure P2, which is between about 40 mTorr and about 60 mTorr. The second pressure P2 is maintained during the deposition of metal layer 42. The ratio P2/P1 may also be greater than about 4 in accordance with some embodiments. The relatively high pressure also improves overhang control, so that less overhang is resulted.

Figure 10B:
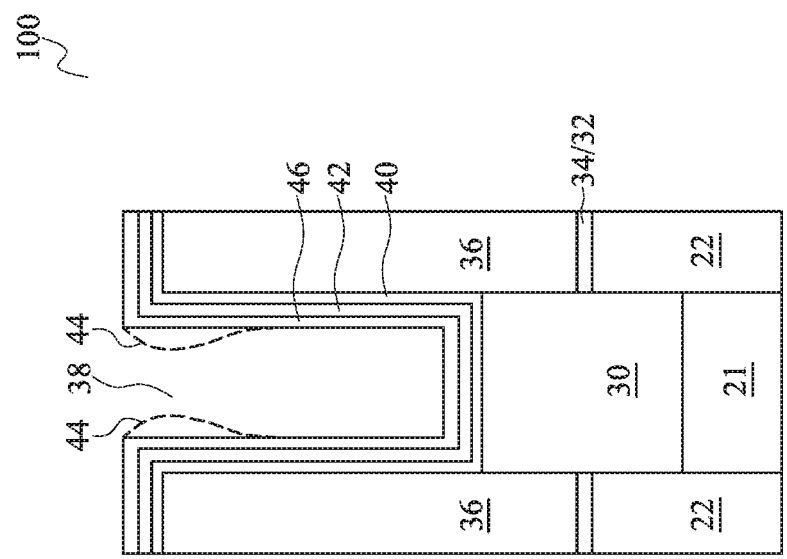

The adverse effect of the overhangs may be explained using FIG. 10B, wherein the structure shown in FIG. 10B is obtained from the plane crossing line 10B-10B in FIG. 10A. As shown in FIG. 10B, slot contact opening 38 may have a high aspect ratio in the illustrated plane, and hence the overhangs 44 may result in process difficulty in the subsequent filling of opening 38, and void may occur in the resulting contact plugs due to the pre-mature sealing of opening 38 at the top. Accordingly, by controlling the process conditions for depositing metal layer 42, the adverse effect of the overhangs is eliminated.

FIG. 10A also illustrates the formation of cap layer 46. In accordance with some embodiments, cap layer 46 comprises a metal nitride such as titanium nitride, tantalum nitride, or the like. In alternative embodiments, cap layer 46 comprises a bottom sub layer and a top sub layer over the bottom sub layer. In some exemplary embodiments, the bottom sub layer is a titanium layer, and the top sub layer is a titanium nitride layer. In alternative embodiments, the bottom sub layer is a tantalum layer, and the top sub layer is a tantalum nitride layer. The thickness of the bottom sub layer may be between about 20 Å and about 300 Å. The thickness of the top sub layer may be between about 10 Å and about 200 Å. Cap layer 46 may be formed using Atomic Layer Deposition (ALD), for example.

Figure 11:
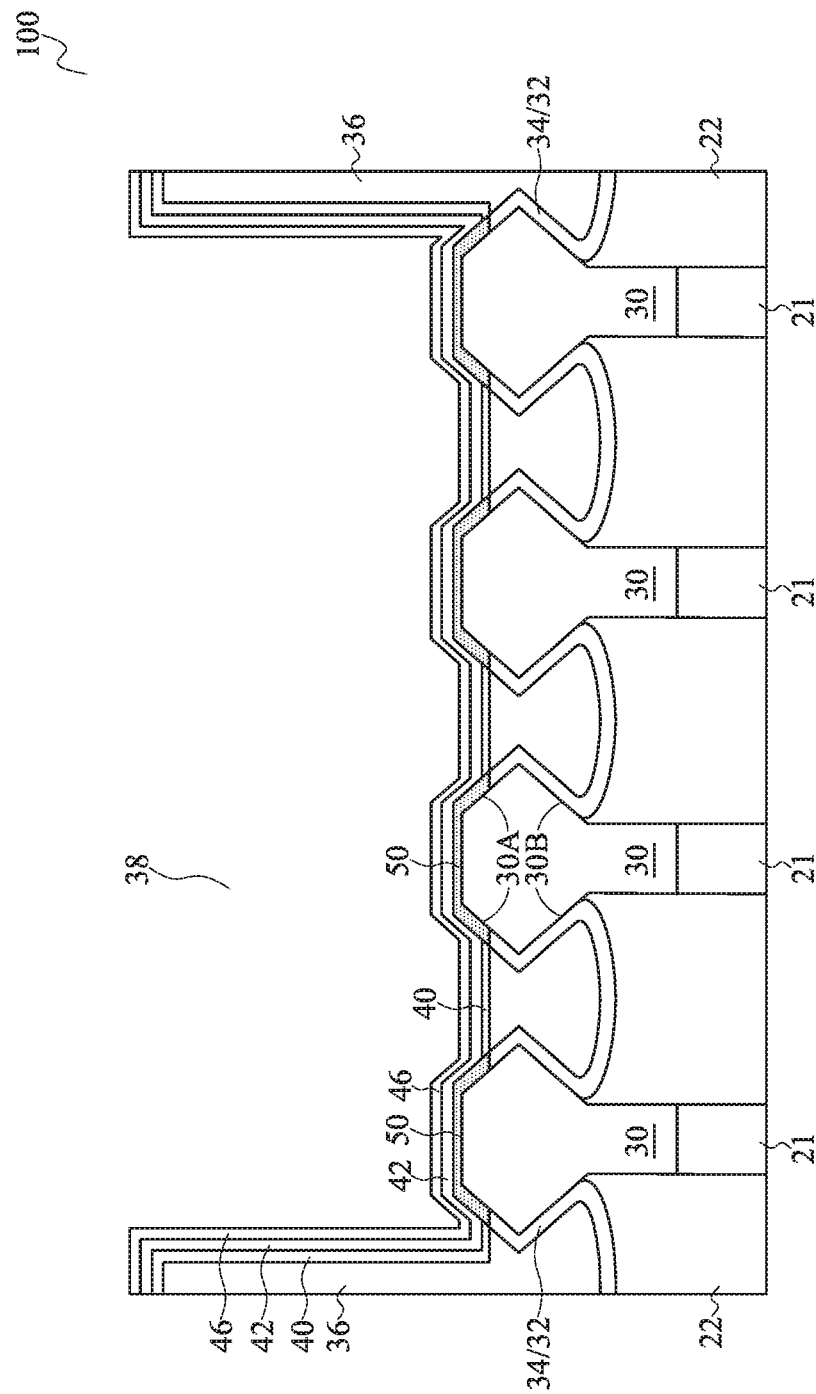

Referring to FIG. 11, an annealing is performed. In accordance with some embodiments, the annealing is performed using, for example, thermal soaking, spike annealing, flash annealing, laser annealing, or the like. The annealing time may be in the range between about 0.1 ms and several minutes. During the annealing, the temperatures in the annealed regions may be in the range between about 300° C. and 1,200° C. As a result of the annealing, metal silicide layer 50 is formed as a result of the reaction between metal layers 40 and 42 and epitaxy regions 30. Throughout the description, the terms "metal silicide" and "metal slicide/germanide" are used as generic terms to refer to metal silicides, metal germanides, and metal silicon germanides. Silicide layer 50 may include nickel silicide or nickel silicon germanide, for example. In some embodiments, the portions of metal layers 40 and 42 (FIG. 10A) adjacent to epitaxy regions 30 are fully consumed, and cap layer 46 is in contact with silicide layer 48. In alternative embodiments, metal layer 40 is fully consumed, while metal layer 42 is partially consumed, and hence over silicide layer 50 resides the remaining metal layer 42, and layer 46 is over and in contact with the remaining upper portion of metal layer 42.

Figure 12:
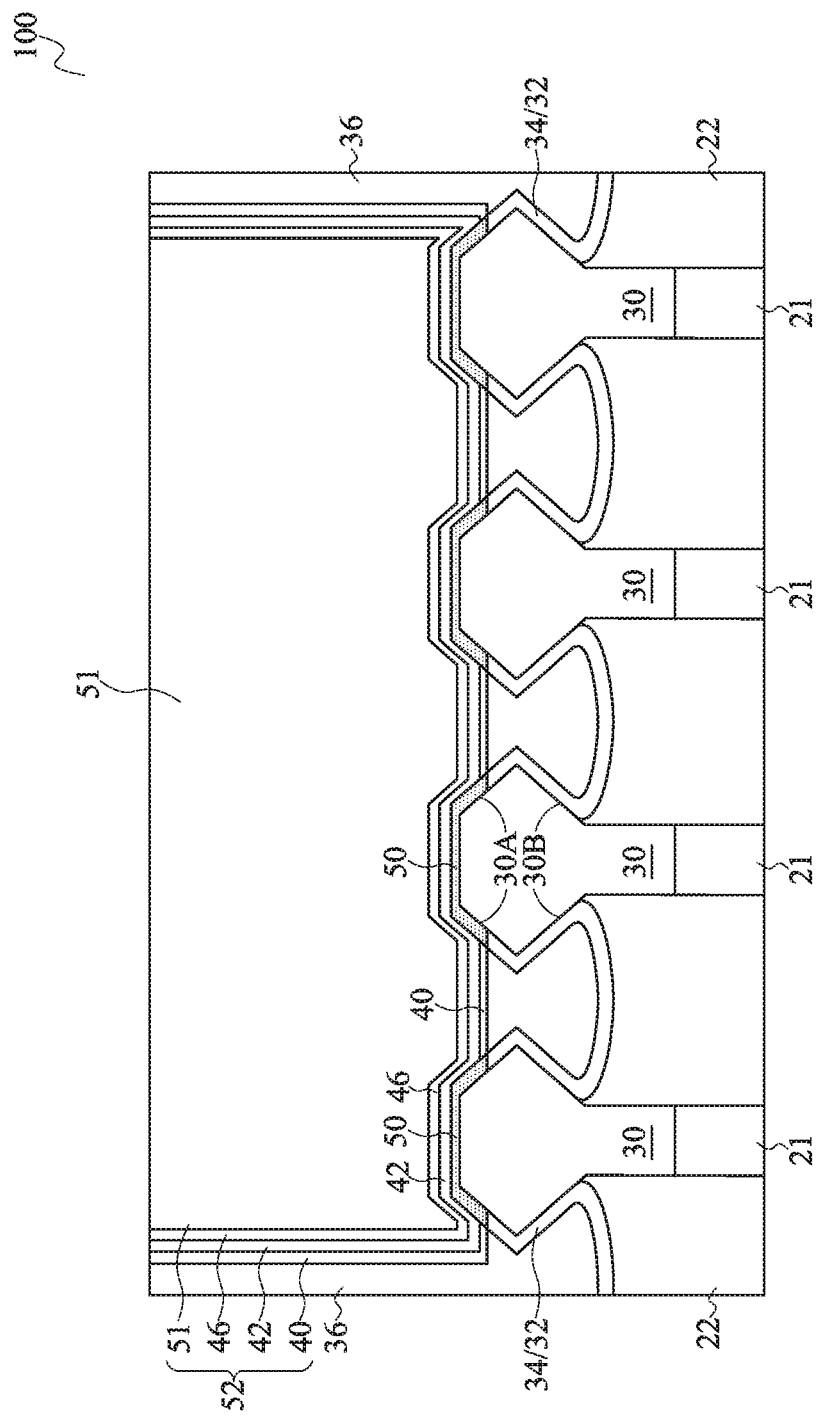

Referring to FIG. 12, the remaining contacting opening 38 (FIG. 11) is filled with conductive material 51. In some embodiments, conductive material 51 comprises tungsten. In alternative embodiments, conductive material 51 comprises other metal or metal alloys such as aluminum, copper, or the like. In accordance with some embodiments, the unreacted portions of layer 42 and cap layer 46 are not removed since the overhang of layers 40 and 42 have been reduced, and hence in the filling of contact opening 38, no void will be formed even if layers 40 and 42 are not removed. In alternative embodiments, cap layer 46 and the remaining portion of layer 42 are removed before contact opening 38 is filled. After the filling of the conductive material 51, a Chemical Mechanical Polish (CMP) is performed to remove the excess portion of conductive material 51. The remaining conductive material 51 and the remaining metal layers 40 and 42 and cap layer 46 (if any) in combination form contact plug 52.

Figure 13:
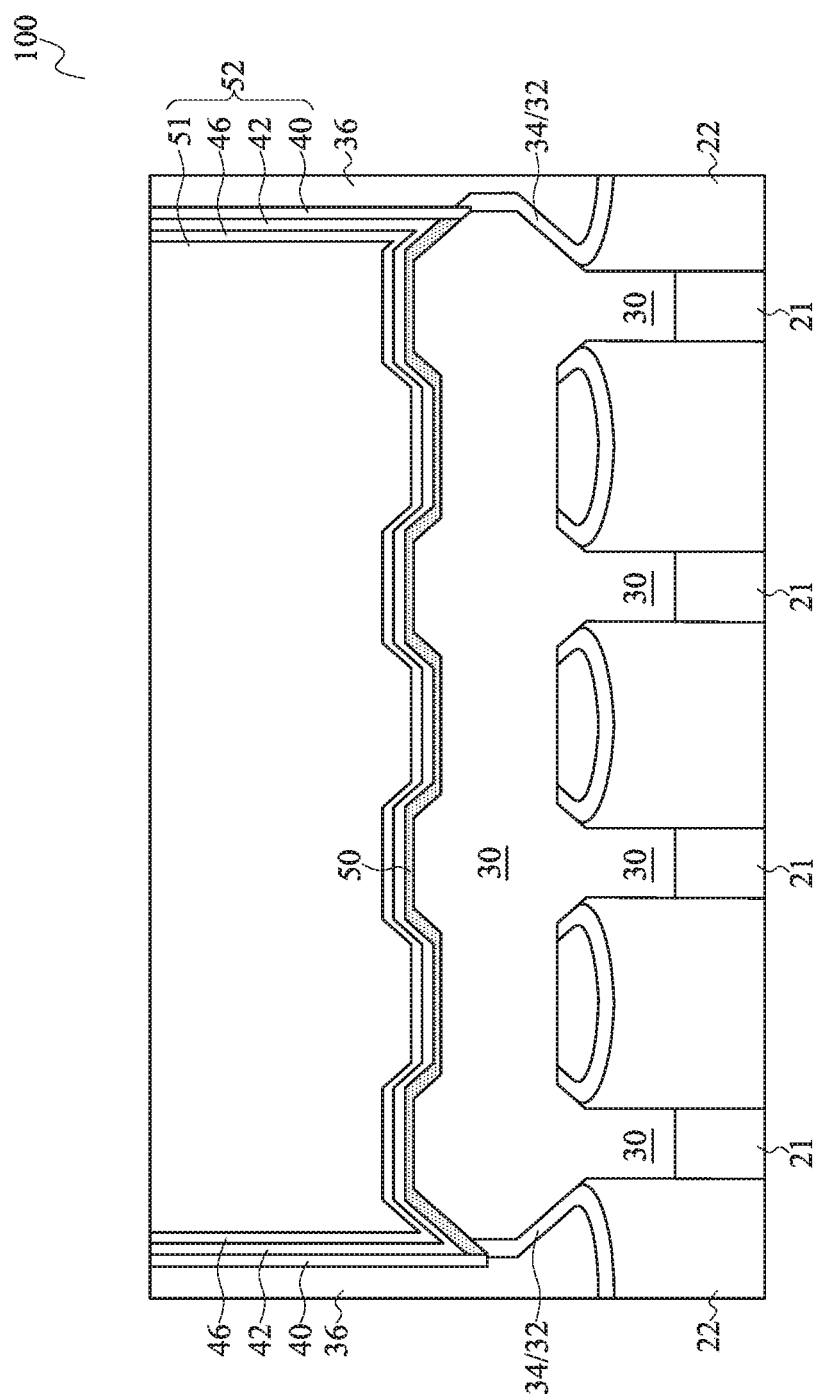
FIG. 13 is a cross-sectional view of a source/drain region of a FinFET and the respective contacts in accordance with alternative embodiments.

FIG. 13 illustrates the contact plug and source/drain regions in accordance with alternative embodiments. These embodiments are similar to the embodiments in FIG. 12, except that epitaxy regions 30 (the source/drain region) are merged to form a continuous source/drain region. As a result, source/drain silicide region 50 also extends over a plurality of epitaxy regions.

The embodiments of the present disclosure have some advantageous features. Since the metal layer for the silicidation is porous due to the use of high ion energy, it is easy for the metal atoms in the metal layer to diffuse to the underlying semiconductor region and to form silicide layers. Furthermore, the metal ions implanted into the ILD may also diffuse to the upward facing facets of the semiconductor regions, and form silicide regions there. Particularly, since the upward facing facets are sloped, by increasing the energy, the metal ions may reach more of the upward facing facets. Accordingly, by depositing the porous metal layer through the use of high ion energy, the area of the resulting silicide layer is increased, resulting in a reduced contact resistance. On the other hand, by forming a metal layer over the porous metal layer using low ion energy, the overhang problem is controlled.

In accordance with some embodiments, a method includes performing a first sputtering to form a first metal film on a surface of a semiconductor region. The first sputtering is performed using a first ion energy. The method further includes performing a second sputtering to form a second metal film over and contacting the first metal film, wherein the first and the second metal films includes a same metal. The second sputtering is performed using a second ion energy lower than the first ion energy. An annealing is performed to react the first and the second metal films with the semiconductor region to form a metal silicide.

In accordance with other embodiments, a method includes forming a gate stack for a transistor, forming a source/drain region for the transistor, wherein the source/drain region is adjacent to the gate stack, and forming an ILD to cover the source/drain region. A contact opening is formed in the ILD, wherein at least a top surface of the source/drain region is exposed. A first metal film is deposited over the top surface of the source/drain region, wherein the step of depositing the first metal film is performed using a first ion energy. A second metal film is deposited over and contacting the first metal film. The second metal film is deposited using a second ion energy lower than the first ion energy. An annealing is performed to react at least the first metal film with the source/drain region to form a metal silicide.

In accordance with yet other embodiments, a method includes forming a gate stack for a transistor, and forming a source/drain region for the transistor, wherein the source/drain region is adjacent to the gate stack. An ILD is formed to cover the source/drain region. A contact opening is formed in the ILD, wherein at least a top surface of the source/drain region is exposed. The method further includes depositing a first metal film on the top surface of the semiconductor region, and depositing a second metal film over and contacting the first metal film. The first and the second metal films include a same metal, and the second metal film has a sheet resistance lower than a sheet resistance of the first metal film. An annealing is performed to react at least the first metal film with the source/drain region to form a metal silicide.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a transistor comprising:
a source/drain region;
an Inter-Layer-Dielectric (ILD) comprising a first portion higher than the source/drain region;
a contact plug extending into the ILD to electrically couple to the source/drain region, wherein the contact plug comprises:
a first metal layer;
a second metal layer, wherein the first metal layer and the second metal layer have different porosity values; and
a conductive region between two vertical portions of the second metal layer, wherein each of the two vertical portions of the second metal layer is between the conductive region and one of two vertical portions of the first metal layer.

2. The device of claim 1, wherein the two vertical portions of the first metal layer are in physical contact with sidewalls of the first portion of the ILD.

3. The device of claim 2, wherein the source/drain region comprises a first portion and a second portion separated from each other by a second portion of the ILD, wherein each of the first metal layer and the second metal layer comprises an additional portion overlapping the second portion of the ILD.

4. The device of claim 1, wherein the source/drain region comprises an upward facing facet and a downward facing facet, and wherein the downward facing facet is buried in second portions of the ILD.

5. The device of claim 1, wherein the first metal layer and the second metal layer comprise a same metal.

6. The device of claim 1, wherein the first metal layer and the second metal layer comprise different metals.

7. The device of claim 1 further comprising a metal nitride cap layer over and contacting the second metal layer.

8. The device of claim 1 further comprises a silicide region over and contacting the source/drain region, wherein the silicide region comprises a metal same as a metal in the first metal layer.

9. The device of claim 1, wherein the second metal layer has a lower porosity value than the first metal layer.

10. A device comprising:
a semiconductor region;
a silicide region over the semiconductor region;
a first metal layer comprising a first portion, with the first portion over and contacting the silicide region;
a conductive region overlying and contacting the first portion of the first metal layer, wherein the first metal layer further comprises a second portion extending on a sidewall of the conductive region; and
a second metal layer having a different sheet resistance than the first metal layer, the second metal layer comprising:
a first portion underlying the first portion of the first metal layer; and
a second portion having a sidewall contacting a sidewall of the second portion of the first metal layer.

11. The device of claim 10, wherein the first metal layer and the second metal layer are formed of a same metal.

12. The device of claim 10, wherein the first metal layer and the second metal layer are formed of a same metal, and having different porosity values.

13. The device of claim 10 further comprising an inter-layer dielectric, wherein:
the second metal layer further comprises a third portion overlying and contacting a top surface of a portion of the inter-layer dielectric; and
the first metal layer further comprises a third portion over and contacting the first portion of the second metal layer.

14. The device of claim 10, wherein the first metal layer and the second metal layer have different sheet resistance values.

15. The device of claim 14, wherein the second metal layer has a sheet resistance value higher than a sheet resistance value of the first metal layer.

16. A device comprising:
a source/drain region;
an Inter-Layer-Dielectric (ILD) comprising a first portion over the source/drain region;
a silicide region over and contacting the source/drain region, wherein the silicide region comprises a top planar portion, and two slanted portions on opposite sides of, and connecting to, the top planar portion; and
a contact plug extending into the ILD to contact the source/drain region, wherein the contact plug comprises:
a conductive region;
a first metal layer comprising portions on opposite sides of the conductive region, wherein the conductive region and the first metal layer in combination form a combined region; and
a second metal layer comprising portions on opposite sides of the combined region, wherein the first metal layer and the second metal layer have different sheet resistance values.

17. The device of claim 16, wherein the first metal layer and the second metal layer are formed of a same metal.

18. The device of claim 16, wherein a sheet resistance value of the first metal layer is higher than a sheet resistance value of the second metal layer.

19. The device of claim 16, wherein the source/drain region comprises two portions separated from each other by a second portion of the ILD, and the first metal layer further comprises a horizontal portion over and contacting a top surface of the second portion of the ILD, and the second metal layer further comprises a horizontal portion over and contacting the horizontal portion of the first metal layer.

20. The device of claim 16, wherein the silicide region and the first metal layer comprise a same metal.

* * * * *